(12) United States Patent
Juang et al.

(10) Patent No.: US 7,075,372 B2
(45) Date of Patent: Jul. 11, 2006

(54) PROGRAMMABLE AUTOMATIC SIGNAL AMPLITUDE CONTROL CIRCUIT

(75) Inventors: Kai-Cheung Juang, Nantou (TW); Yen-Horng Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 42 days.

(21) Appl. No.: 10/964,390

(22) Filed: Oct. 13, 2004

(65) Prior Publication Data

US 2005/0264359 A1    Dec. 1, 2005

(30) Foreign Application Priority Data

May 31, 2004  (TW) ................. 93115486 A (51) Int. Cl.
*H03G 3/10* (2006.01)
(52) U.S. Cl. .................................. 330/279
(58) Field of Classification Search .............. 330/279, 330/129, 259, 274
See application file for complete search history.

(56) References Cited

U.S. PATENT DOCUMENTS 5,825,239 A * 10/1998 Adal ........................ 327/563
5,838,194 A * 11/1998 Khoury ..................... 330/139
6,674,328 B1 * 1/2004 Uto et al. .................. 330/259
2003/0148745 A1   8/2003 Nystrom et al. ........... 455/136

OTHER PUBLICATIONS

"A Low Power Monolithic AGC with Automatic DC Offset Cancellation for Direct Conversion Hybrid CDMA Transceiver Used in Telemetering" Cheung et al.; 2001.
"A BiCMOS 300ns Attack-Time AGC Amplifier with Peak-Defect and Hold Feature for High-Speed Wireless ATM Systems" Drenski et al.; 1999.

* cited by examiner

*Primary Examiner*—Robert Pascal
*Assistant Examiner*—Hieu Nguyen
(74) *Attorney, Agent, or Firm*—Thomas, Kayden, Horstemeyer & Risley (57) ABSTRACT

A programmable automatic signal amplitude control circuit, comprising a variable gain amplifier and a negative feedback circuit. The negative feedback circuit includes a first circuit, and a second circuit having a peak detector, a level adjustable amplifier, and a voltage/current converter, and a capacitor. Using a first current applied from the first circuit and a second current applied from the second circuit to control a control signal, signal amplitude is controlled to approach a setup amplitude.

9 Claims, 8 Drawing Sheets

PROGRAMMABLE AUTOMATIC SIGNAL AMPLITUDE CONTROL CIRCUIT

BACKGROUND

The present, invention relates to a programmable automatic signal amplitude control circuit, and more particularly, to a programmable automatic signal amplitude control circuit applied in a high frequency related area.

In wireless communication system, a signal amplitude control circuit is required for adjust input signal variation. Conventionally, signal, amplitude is controlled by a closed loop signal amplitude control circuit.

Figure 1:
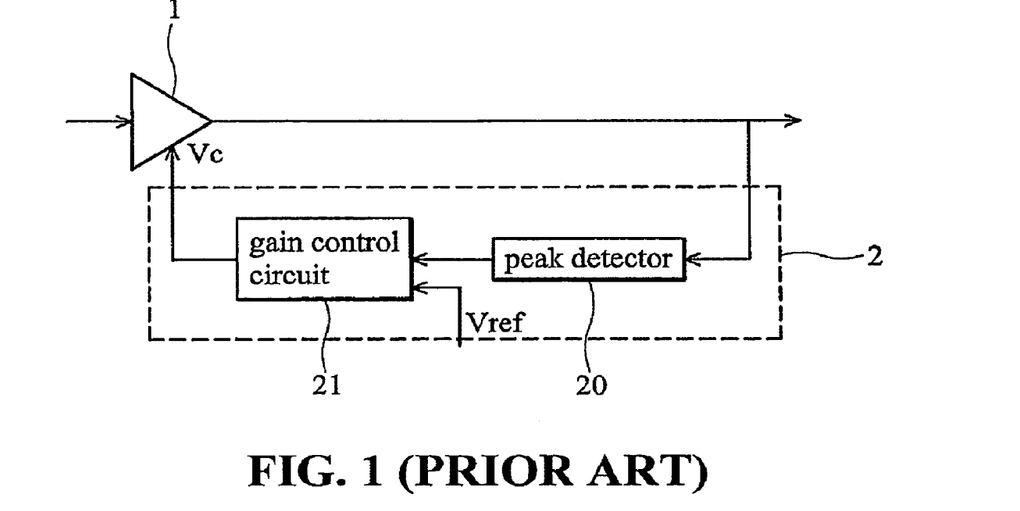
FIG. 1 is a diagram of a conventional signal amplitude control circuit.

A conventional signal amplitude control circuit is shown in FIG. 1, comprising a variable gain amplifier 1 with gain adjusted according to a control voltage applied from a negative feedback circuit 2 consisting of a peak detector 20 and a gain control circuit 21, the peak detector 20 detecting the amplitude of a signal output from the variable amplifier 1. The signal output from the peak detector 20 is then compared with a reference voltage Vref by a gain control circuit 21. Reference voltage Vref controls the value of the output signal Vc to maintain signal amplitude approaching a setup amplitude.

Figure 2:
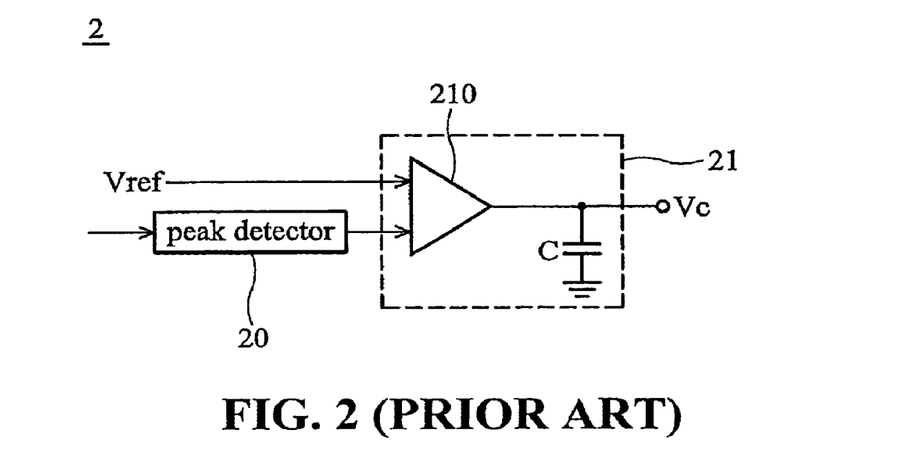
FIG. 2 is a diagram of a conventional negative feedback circuit.

FIG. 2 illustrates a negative feedback circuit 2 based on a reference voltage Vref. A signal output from a peak detector is compared with a reference, voltage Vref through a transconductance unit 210 for outputting corresponding current signal. The current signal is converted to a corresponding control voltage signal Vc to control the variable gain amplifier 1 shown in FIG. 1.

Figure 3:
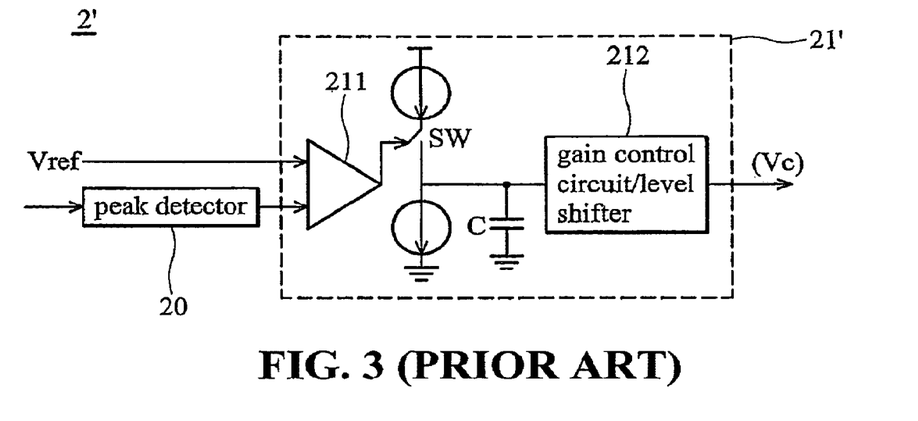
FIG. 3 is a diagram of another conventional negative feedback circuit.

FIG. 3 illustrates another negative feedback circuit 2' according to a reference voltage Vref. An output signal from a peak detector 20 is compared with a reference voltage Vref through a comparator 211 and output as a comparison signal for controlling a switch SW. Current flows through capacitor C for integration to corresponding voltage, then converted to control voltage Vc through a gain control circuit or a level shifter 212.

As shown in FIG. 2, one terminal of the negative feedback circuit 2 receives the reference voltage Vref directly, while input signals at another terminal thereof are detected by the peak detector. Thus, input signals have more relative errors due to process variation during manufacture of the peak detector and Vref. As well, the conventional negative feedback circuit is based on reference voltage. To change output signal amplitude, multiple sets of reference voltage must be set, increasing circuit complexity.

SUMMARY

An embodiment of the invention comprises a programmable automatic signal amplitude control circuit, comprising a variable gain amplifier and a negative feedback circuit. The negative feedback circuit comprises a first circuit, a second circuit comprising a peak detector, a level adjustable amplifier, and a voltage/current converter, and a capacitor. The variable gain amplifier receives an input signal and a control signal controls the gain of the variable gain amplifier, and outputs an output signal. The first circuit is set between a first voltage source and a first node, with the first node coupled to the output of the negative feedback circuit. The second circuit is set between the first node and a second voltage source, comprising the peak detector receiving the output signal to detect the amplitude level of the output signal for output as a rectified signal, the level adjustable amplifier receiving the rectified signal and converting a voltage signal for output, the voltage/current converter receiving the voltage signal for conversion to a corresponding second current, such that when the voltage signal increases, the second current increases and the capacitor receives a third current to generate the control signal, wherein the third current is a current differential between the first current and the second current. The output signal of the variable gain amplifier comprises setup amplitude, and when, the amplitude of the output signal is lower than the setup amplitude, the second current decreases such that the first current exceeds the second current, and the amplitude of the output signal increases until approaching the approximated setup amplitudes. When the amplitude of the output signal exceeds the setup amplitude, the second current increases, such that the first current is smaller than the second current, and the amplitude of the output signal decreases until approaching the setup amplitude.

BRIEF DESCRIPTION OF THE DRAWINGS

The present invention can be more fully understood by reading the subsequent detailed description and examples with references made to the accompanying drawings, wherein.

DETAILED DESCRIPTION

Figure 4:
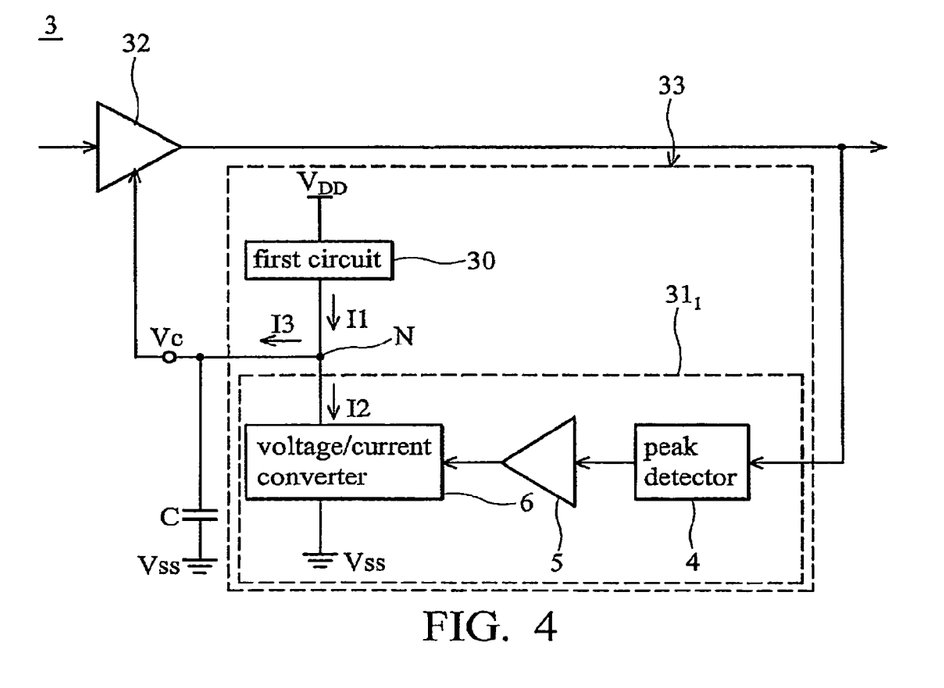
FIG. 4 is a circuit diagram according to an embodiment of the invention.

FIG. 4 shows an embodiment of a signal amplitude control circuit 3. The signal control circuit 3 includes a variable gain amplifier 32 and a negative feedback circuit 33. The negative feedback circuit 33 includes a first circuit 30, a second circuit 31, and a capacitor C.

The variable gain amplifier 32 has two inputs receiving an input signal and a control signal Vc. Gain thereof is maintained proportional to the voltage of the control signal Vc. The variable gain amplifier 32 has one output for a corresponding output signal.

The negative circuit 33 comprises a first circuit 30 set between a high voltage source VDD and a node N generating a first current I1. The first current I1 flows through the high voltage source VDD to the node N.

The second circuit 31 is set between the node N and a low voltage source VSS. The second circuit 31 includes a peak detector 4 having an input terminal to receive the output signal from the variable gain amplifier 32 and detect peak value of the amplitude thereof, outputting a rectified signal. A level shift amplifier 5 has an input terminal coupled to the peak detector 4 to receive the rectified signal for voltage level adjustment and output a voltage signal. A voltage/current converter 6 has an input terminal coupled to the level shift amplifier 5 to receive the voltage signal for conversion to a corresponding second current I2 directly proportion to the input signal of the peak detector 4, and output through the node N to the low voltage source VSS.

The capacitor C is set between a first node N and the low voltage source VSS, receiving a third current I3 to charge/discharge and output the control signal Vc, wherein I3=I1−I2.

In practice, the capacitor C is initially charged by the first current I1 to generate the control signal Vc. Setup gain of the variable gain amplifier 32 is generated according to the voltage value of the control signal Vc for outputting the output signal with a setup amplitude. The output signal output from the variable gain amplifier 32 is then detected by the peak detector 4 and sent to the level shift amplifier 5 and voltage/current converter 6 to generate a second current I2 approaching to the first current I1. When the amplitude of the output signal is pulled lower than the setup amplitude, the second current I2 decreases, the first current I1 is larger than the second current I2, the capacitor C is charged by the third current I3 for increasing the voltage of the control signal Vc, and the gain of the variable gain amplifier 32 increases for increasing the amplitude of the output signal till approaching the setup amplitude. On the contrary, when the amplitude of the output signal is pulled higher than the setup amplitude, the second current I2 increases, the first current I1 is less than the second current I2, the capacitor C is discharged by the third current I3 for reducing the voltage of the control signal Vc, and the gain of the variable gain amplifier decreases for decreasing the amplitude of the output signal till approaching the setup amplitude.

Figure 5:
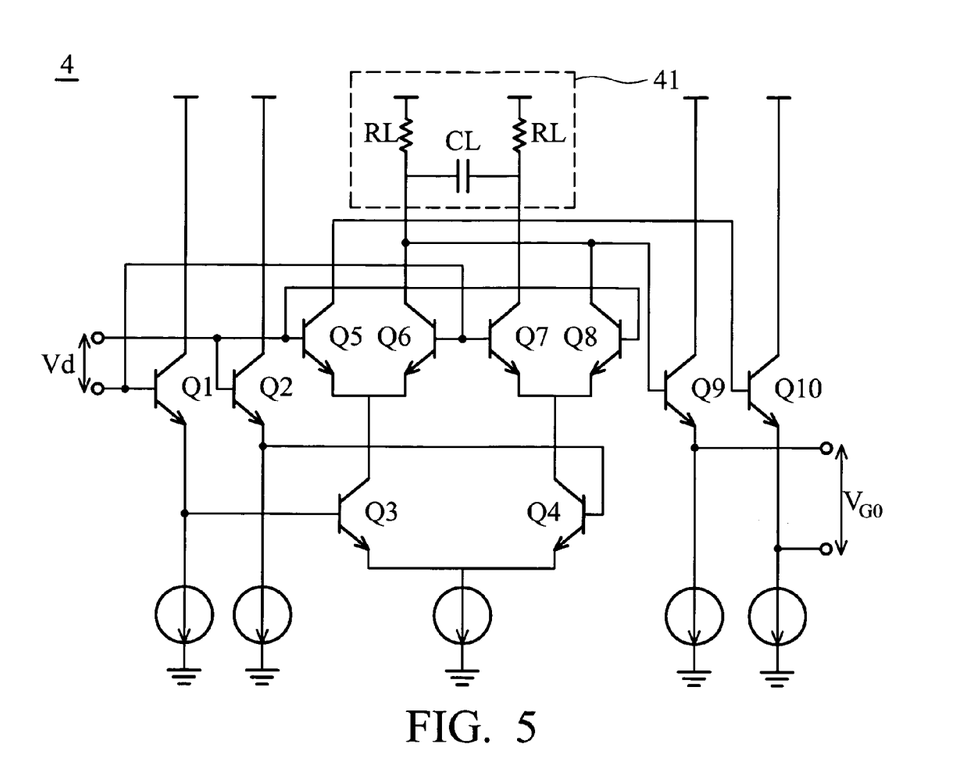
FIG. 5 is a detailed circuit diagram of a peak detector according to an embodiment of the invention.

FIG. 5 shows a detailed circuit of the peak detector 4 shown in FIG. 4, such as a conventional Gilbert-cell mixer. Transistors Q1, Q2 are input shift transistors receiving a pair of differential signals Vd, transistors Q3, Q4 are transconductors of the peak detector 4, transistors Q5, Q6, Q7 and Q8 are a switching stage of the peak detector 4, transistors Q9 and Q10 are output level shift transistors, symbol RL is directed to a loading resistor, and low pass filter 41 of the peak detector 4 consists of a capacitor C and the resistors RL. If the input differential signal Vd is ACOS (wt), A representing an amplitude of the input differential signal, and w a frequency of the differential signal, input signal is input to the mixer of the peak detector 4 and the mixed signal is given by ACOS (wt)×ACOS(wt)=$A^2/2(1+COS2\ wt)$, wherein the high frequency part is filtered by the low pass filter 41. The peak value of the input signal is detected and then, a rectified signal $V_{GO}$ is output through transistors Q9 and Q10.

Figure 6:
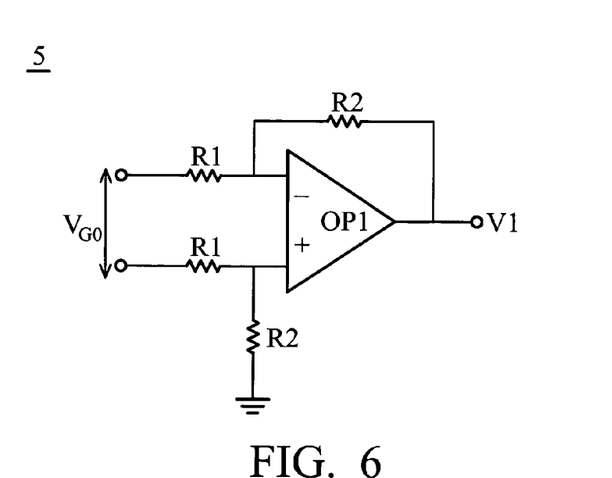
FIG. 6 is a detailed circuit diagram of a level adjustable amplifier according to an embodiment of the invention.

FIG. 6 shows a detailed circuit of a level shift amplifier 5, comprising an operation amplifier OP1 and a negative feedback circuit consisting of resistors R1 and R2. The operation amplifier OP1 has an inverted terminal (−) coupled to a first input through a first resistor R1, a non-inverted terminal (+) coupled to a second input terminal, and a second resister R2 through another first resistor R1, and an output terminal coupled feedback to the inverting terminal (−) through another second resistor R2. The differential signal $V_{GO}$ output from the peak detector 4 is input to the first input terminal and the second input terminal of the level shift amplifier 5.

The gain of the level shift amplifier 5 is R2/R1, relating only to the ratio of the resistors. Using resistors having the same manufacturing process, the ratio of the gain will not be influenced by variations in the process. As well, the differential signal is converted to a single signal by the level shift amplifier 5.

Figure 7:
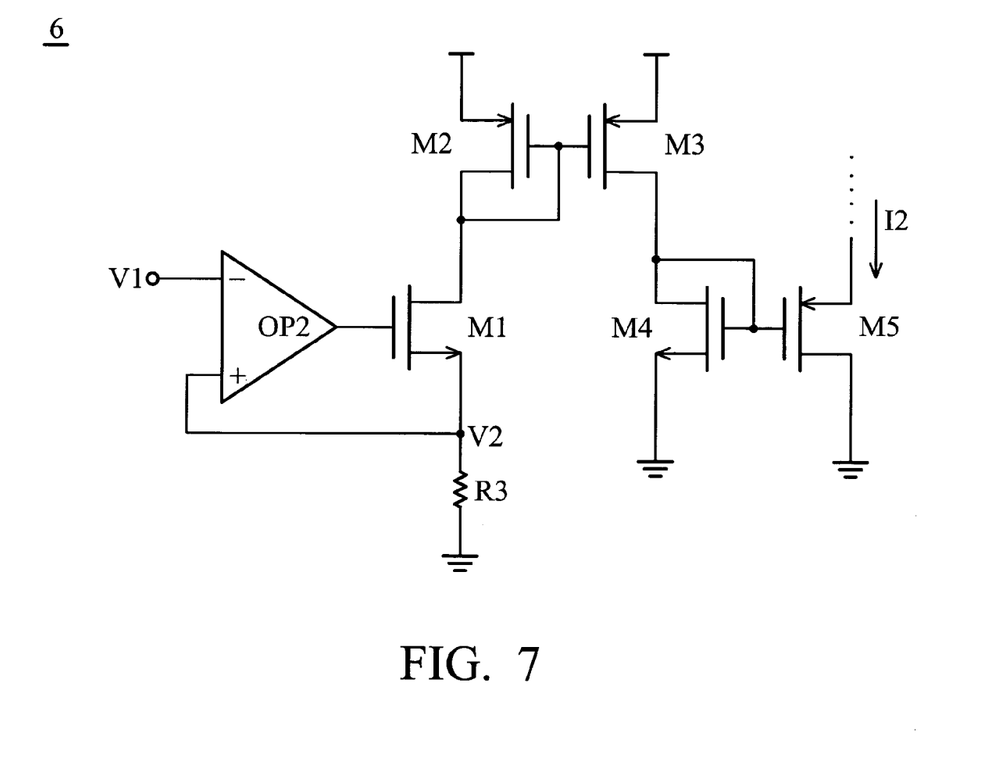
FIG. 7 is a detailed circuit diagram of a voltage/current converter according two an embodiment of the invention.

FIG. 7 shows a detailed circuit of a voltage/current converter 6 shown in FIG. 4. The voltage/current converter 6 has an operation amplifier OP2 including a negative feedback loop as a voltage follower for controlling a voltage V2 approximating voltage V1, and coupled to a resistor R3, for converting the voltage V2 to a corresponding current signal (V1/R3). The current signal finally flows to a plurality of transistors M2, M3, M4 and M5 providing a fixed enlarged gain or a reduced gain and change the direction of the current signal. Finally, the current flowing out through the drain of the transistor M5 represents the second current I2 shown in FIG. 4.

Figure 8:
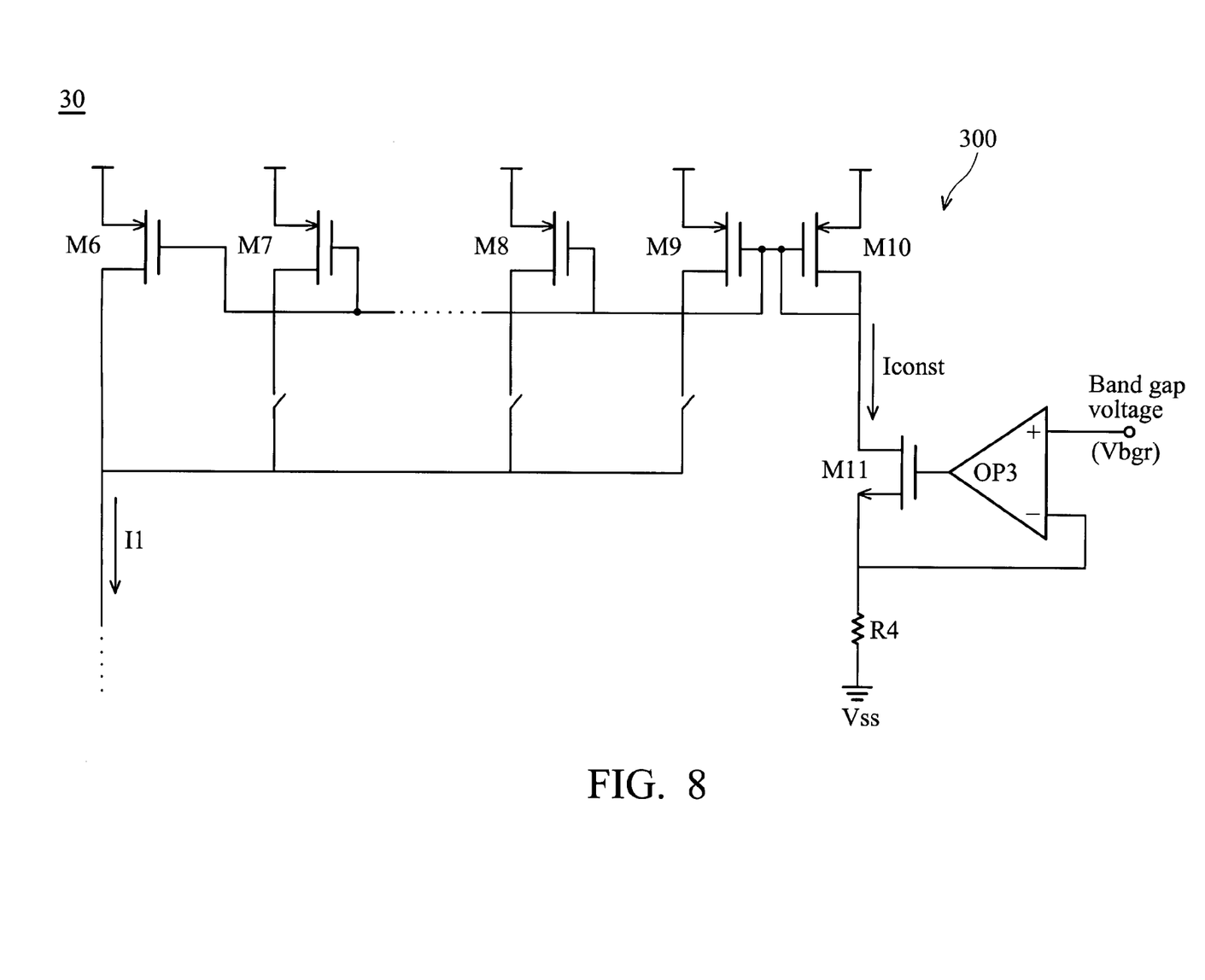
FIG. 8 is a detailed circuit diagram of the first circuit according to an embodiment of the invention.

FIG. 8 shows a detailed circuit of the first circuit 30 shown in FIG. 4. The first circuit 30 comprises an operation amplifier OP3, wherein one end of the operation amplifier OP3 receives a constant voltage Vbgr, and the other is coupled to a low voltage source Vss through a resistor R4. The output end of the operation amplifier OP3 is coupled to a transistor M11 set between a current mirror 300 and the resistor R4. The constant current Iconst is generated by the constant voltage Vbgr, such as band gap voltage, the operation amplifier OP3, and the resistor R4, and output from the drain of the transistor M11 and sent to the transistors M6~M10 of a current mirror for adjusting the value of the first current I1.

Figure 9A:
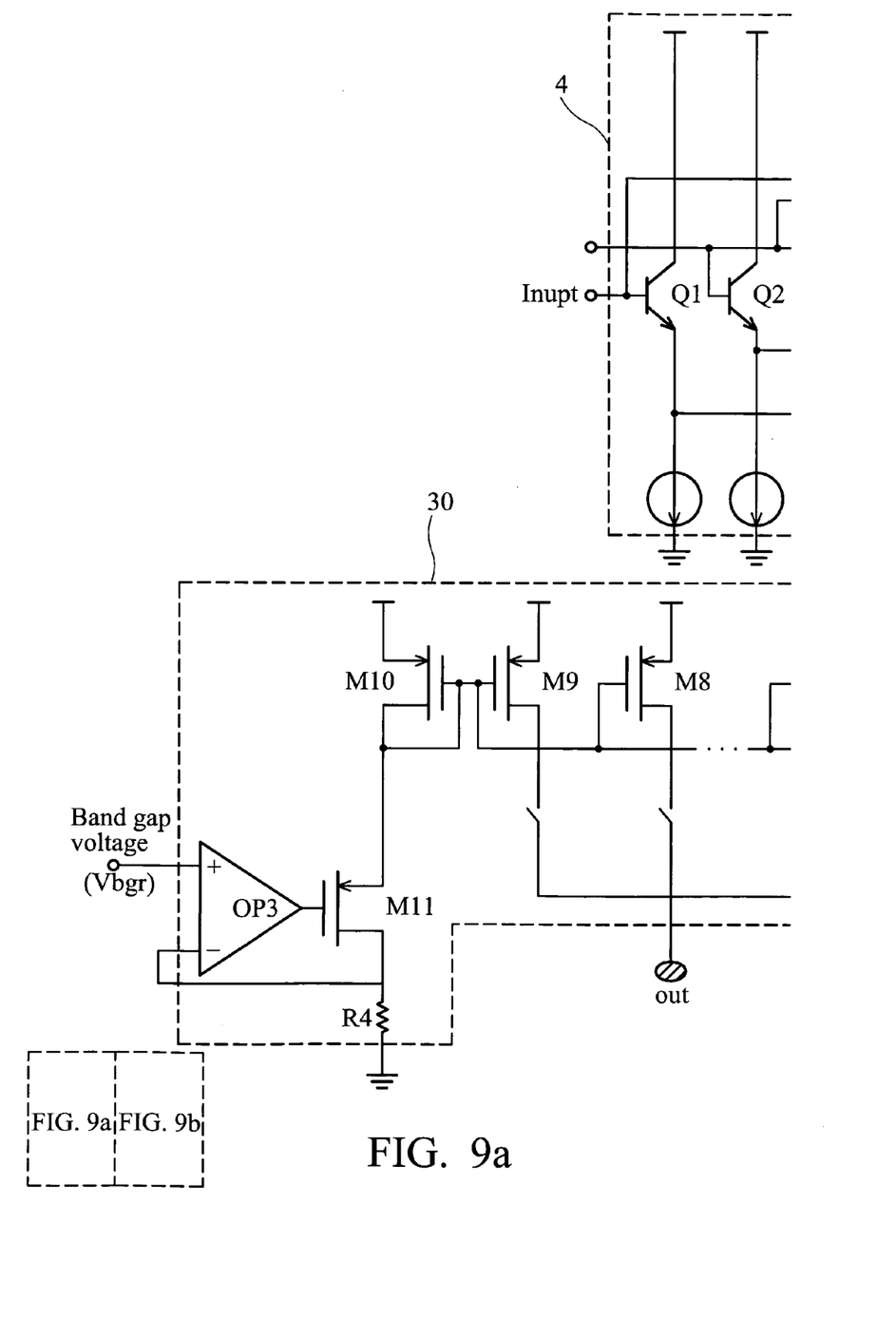
FIGS. 9a and 9b are detailed circuit diagrams according to an embodiment of the invention.
Figure 9B:
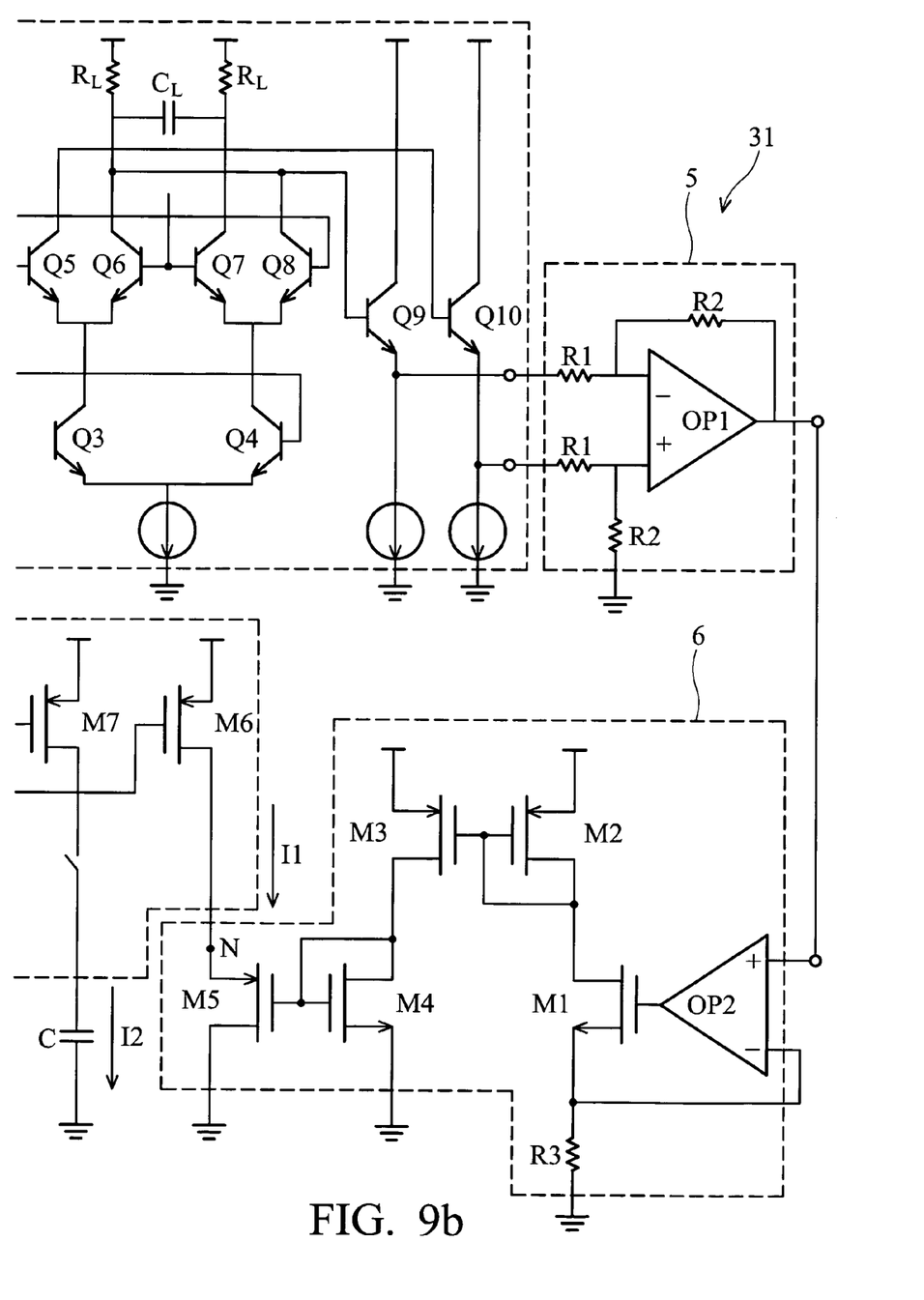

FIGS 9a and 9b show detailed circuits in FIG. 4, with peak detector 4, level shift amplifier 5, voltage/current converter 6 and first circuit 30 as described in FIGS. 5 to 8. The capacitor C is set between the first circuit and the low voltage source Vss for conversion the current to a corresponding control voltage (Vc). Capacitance depends on convergence time and damping factor according to the specifications of the system and can be adjusted.

Currents I1 and I2 are generated by similar topologies (voltage divided by resistor), the process variation can be minimized by this symmetric topology. Besides, due to the gain of the variable gain amplifier 32 being determined by the control signal generated the first current I1 charged/discharged by the capacitor, adjustable amplitude is generated by adjusting the first current, suitable for use with varied systems.

Figure 10:
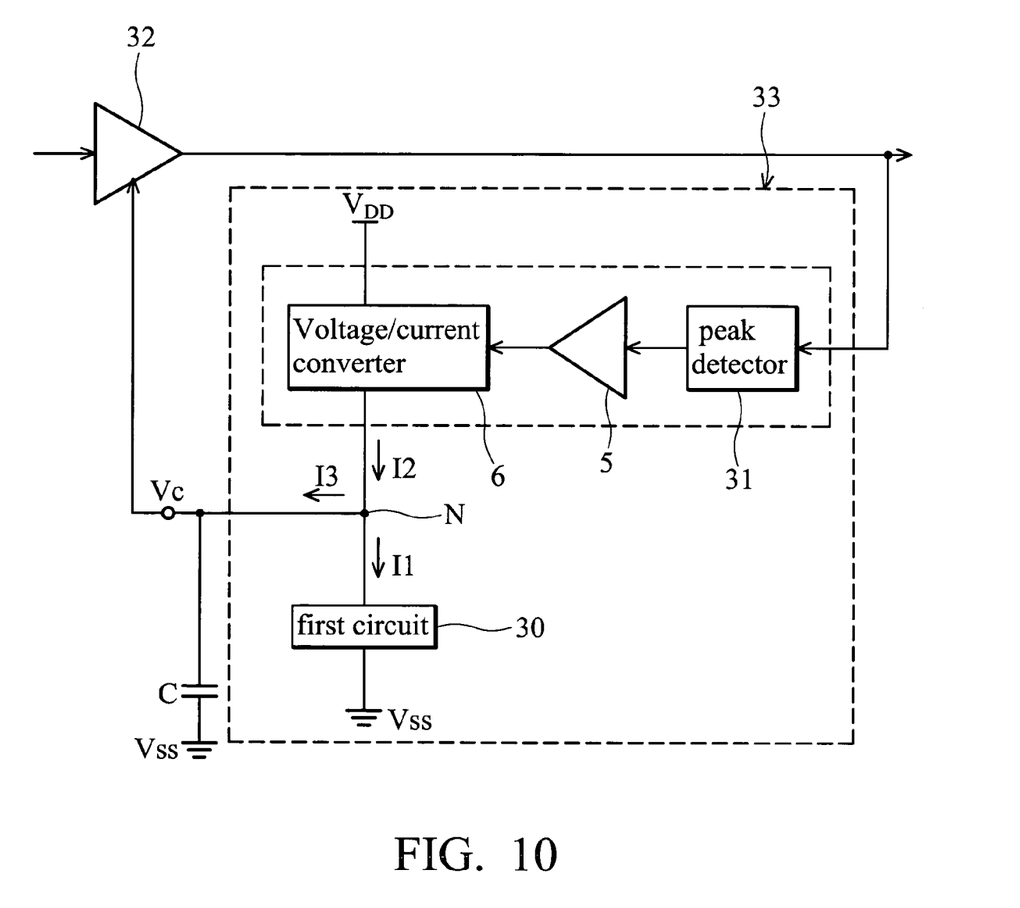
FIG. 10 is another circuit diagram according to another embodiment of the invention.

FIG. 10 illustrates another circuit similar to that in FIG. 4, with the main difference that the gain of the variable gain amplifier 32 is inversely proportional to a voltage of the control signal Vc. A first circuit 30 is set between a node N and a low voltage source Vss to generate a first current I1, flowing through the node N to the low voltage source Vss. A second circuit 31 is set between a high voltage source VDD and the node N, and generates a second current I2 through the high-voltage source VDD to the node N. When the amplitude of the output signal is pulled lower than the setup amplitude signal, the second current I2 decreases, the first current I1 exceeds the second current I2, the capacitor C is discharged by a third current I3 for reducing the voltage of the control signal Vc, the gain of the variable gain amplifier 32 is increased, and the amplitude of the output signal is increased to approach the setup amplitude. When the amplitude of the output signal is larger than the setup amplitude, the second current I2 increases, the first current I1 is less than the second current I2, the capacitor C is charged by a third current I3 for increasing the voltage of the control signal Vc, the gain of the variable gain amplifier 32 is reduced, and the amplitude of the output signal is decreased to approach the setup amplitude.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A programmable automatic signal amplitude control circuit, comprising:
   a variable gain amplifier, gain of which is maintained by received control signals, outputting an out signal;
   a negative feedback circuit, comprising:
   a first circuit, set between a first voltage source and a first node, the first node coupled to an output terminal of the negative feedback circuit; and
   a second circuit, set between the first node and a second voltage source, wherein the second circuit comprises:
   a peak detector, receiving the output signal and detecting the amplitude level of the input signal to output a rectifying signal;
   a level adjustable amplifier, receiving the rectifying signal for conversion to a voltage signal; and
   a voltage/current converter, receiving the voltage signal for conversion to a corresponding second current, whereby the voltage signal increases, the second current increases; and
   a capacitor, receiving a third current to generate the control signal, wherein the third current is defined by a differential between a first current output from the first circuit and the second current;
   the output signal of the variable gain amplifier further comprising a setup amplitude, such that when the amplitude of the output signal is lower than the setup amplitude, the second current decreases, such that the first current exceeds the second current, and the amplitude of the output signal increases to approach the setup amplitude; and when the amplitude of the output signal exceeds the setup amplitude, the second current increases, such that the first current is smaller than the second current, and the amplitude of the output signal decreases to approach to the setup amplitude.

2. The circuit as claimed in claim 1, wherein the first voltage source is a high voltage source, the first current flows through the high voltage source to the first node, the second voltage source is a low voltage source, and the second current flows through the first node to the low voltage source.

3. The circuit as claimed in claim 2, wherein the gain of the variable gain amplifier and the voltage of the control signal are directly proportional, and when the first current exceeds the second current, the capacitor is charged by the third current to increase the control signal, gain and the amplitude, and when the first current is lower than the second current, the capacitor is discharged by the third current to decrease the control signal, the gain and the amplitude.

4. The circuit as claimed in claim 1, wherein the first voltage source is a low voltage source, and the first current flows through the first node to the low voltage source; the second voltage source is a high voltage source, and the second current flows through the high voltage source to the first node.

5. The circuit as claimed in claim 4, wherein the gain of the variable gain amplifier and the control signal are inversely proportional, and when the first current exceeds the second current, the capacitor is discharged by the third current to decrease the control signal, the gain is increased and the amplitude is increased, and when the first current is lower than the second current, the capacitor is charged by the capacitor to increase the control signal, the gain and the amplitude is decreased.

6. The circuit as claimed in claim 1, wherein the first circuit comprises an operating amplifier, one end which is coupled to a constant voltage, and the other coupled to the low voltage source through a resistor, and the output end of the operating amplifier is coupled to a first transistor set between a current mirror and the resistor.

7. The circuit as claimed in claim 1, wherein the output signal is a differential signal, and the peak detector comprises:
   a pair of level shift transistors receiving the differential signal; and
   a mixer, comprising a pair of transconductors coupled to the pair of level shift transistors, a plurality of switch transistors coupled to the differential signals for mixing the differential signal, a low-pass filter filtering the high frequency components of a mixed differential signal for outputting a filtered differential signals, and further coupled to another pair of level shift transistors for the filtered differential signal.

8. The circuit as claimed in claim 7, wherein the level adjustable amplifier comprises:
   an operating amplifier, comprising an inverted end coupled to an first input end through a first resistor, a non-inverted end coupled to a second input end through another first resistor and coupled to the low voltage source through a second resistor, and an output end coupled to the inverted end through another second resistor.

9. The circuit as claimed in claim 1, the voltage signal comprising a first voltage signal, the voltage/current converter comprising:
   a voltage follower, outputting a second voltage signal approaching the first voltage signal;
   a resistor, converting the second voltage signal to a corresponding current signal; and
   a current mirror, comprising a plurality of transistors to amplify the current signal and change the direction of the current, and output the corresponding second current.

* * * * *